(12) United States Patent
Meeuwsen et al.

(10) Patent No.: US 12,087,678 B2
(45) Date of Patent: Sep. 10, 2024

(54) ELECTRONIC MOLDED PACKAGE

(71) Applicant: Ampleon Netherlands B.V., Nijmegen (NL)

(72) Inventors: Frans Meeuwsen, Nijmegen (NL); Jurgen Raben, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 383 days.

(21) Appl. No.: 17/440,268

(22) PCT Filed: Mar. 18, 2020

(86) PCT No.: PCT/NL2020/050180
§ 371 (c)(1),
(2) Date: Sep. 17, 2021

(87) PCT Pub. No.: WO2020/190137
PCT Pub. Date: Sep. 24, 2020

(65) Prior Publication Data
US 2022/0157699 A1 May 19, 2022

(30) Foreign Application Priority Data
Mar. 18, 2019 (NL) .................................. 2022759

(51) Int. Cl.
*H01L 23/495* (2006.01)
*H01L 23/00* (2006.01)
(Continued)

(52) U.S. Cl.
CPC ...... *H01L 23/49562* (2013.01); *H01L 23/053* (2013.01); *H01L 23/66* (2013.01);
(Continued)

(58) Field of Classification Search
CPC . H01L 23/49562; H01L 23/053; H01L 23/66; H01L 23/49541; H01L 2224/48151;
(Continued)

(56) References Cited

U.S. PATENT DOCUMENTS 4,012,766 A 3/1977 Phillips et al.
4,246,697 A 1/1981 Smith
(Continued)

FOREIGN PATENT DOCUMENTS

EP 3340462 6/2018
JP 57155761 A * 9/1982 ....... H01L 23/49541
JP 62169354 A * 7/1987 ....... H01L 23/49541

OTHER PUBLICATIONS

International Searching Authority, International Search Report and Written Opinion mailed on Jul. 3, 2020, issued in connection with International Patent Application No. PCT/NL2020/050180, filed on Mar. 18, 2020, 14 pages.

*Primary Examiner* — Shaun M Campbell
*Assistant Examiner* — Teresa M. Arroyo
(74) *Attorney, Agent, or Firm* — McDonnell Boehnen Hulbert & Berghoff LLP

(57) ABSTRACT

Example embodiments relate to an electronic package, to an electronic device comprising such a package, and to a lead frame for manufacturing the electronic package. Some examples may particularly relate to electronic packages in which radiofrequency (RF) circuitry is arranged. According to the example embodiments, a width of the clamping portion is substantially larger than the width of the lead end portion, the width of the clamping portion being chosen such that bending of the inner part and/or body part relative to the outer part during the application of the molding compound was substantially prevented thereby having avoided flash and/or bleed of molding compound onto the inner part.

9 Claims, 10 Drawing Sheets

(51) Int. Cl.
*H01L 23/053* (2006.01)
*H01L 23/66* (2006.01)

(52) U.S. Cl.
CPC ...... *H01L 24/48* (2013.01); *H01L 2223/6611* (2013.01); *H01L 2224/48151* (2013.01)

(58) Field of Classification Search
CPC . H01L 2224/48247; H01L 2224/49111; H01L 2224/49175; H01L 23/10; H01L 23/4334; H01L 23/047; H01L 2223/6611; H01L 24/48
USPC .......................................................... 257/695
See application file for complete search history.

(56) References Cited

U.S. PATENT DOCUMENTS

| | | | |
|---|---|---|---|
| 8,207,597 B2* | 6/2012 | Punzalan | H01L 21/565 |
| | | | 257/E23.032 |
| 2004/0046240 A1* | 3/2004 | Hasebe | H01L 23/49548 |
| | | | 257/E23.047 |
| 2005/0012186 A1 | 1/2005 | Zimmerman | |
| 2006/0108679 A1 | 5/2006 | Hauser et al. | |
| 2009/0023248 A1 | 1/2009 | Abdo et al. | |
| 2018/0082915 A1 | 3/2018 | Viswanathan et al. | |
| 2018/0096937 A1 | 4/2018 | Saegusa | |
| 2018/0122729 A1 | 5/2018 | Ping et al. | |
| 2019/0229077 A1* | 7/2019 | De Boet | H01L 23/66 |

\* cited by examiner

ELECTRONIC MOLDED PACKAGE

CROSS-REFERENCE TO RELATED APPLICATIONS

The present application is a national stage entry of PCT/NL2020/050180 filed Mar. 18, 2020, which claims priority to NL 2022759 filed Mar. 18, 2019, the contents of each of which are hereby incorporated by reference.

The present invention relates to an electronic package, to an electronic device comprising such a package and to a lead frame for manufacturing the electronic package. The present invention particularly relates to electronic packages in which radiofrequency (RF) circuitry is arranged, in particular high power RF transistors, such as Silicon based laterally diffused metal-oxide-semiconductor (LDMOS) transistors or Gallium-Nitride based field-effect transistors (FETs).

Electronic packages for high power RF power transistors are known in the art. An example thereof is illustrated in cross-sectional view in FIG. 1. A corresponding schematic top view is presented in FIG. 2A. Known package 1 comprises a substrate 10, leads 20 that are spaced apart from substrate 10 and a body 30 of a solidified molding compound. Body 30 is fixedly attached to substrate 10 and leads 20. More in particular, body 30 keeps leads 20 and substrate 10 at a fixed mutual position. Moreover, leads 20 penetrate body 30 from an inside of package 1 to an outside of the package 1.

Each lead 20 comprises an inner part 21 that extends within the inside of package 1 and that is substantially free of molding compound to allow one or more bondwires 61 to be bonded thereto.

Each lead 20 further comprises a body part 22 that extends within body 30, and an outer part 23 that extends on the outside of the package 1 and that is substantially free of molding compound.

In package 1, a width w1 of a lead end portion 231 of outer part 23 is substantially smaller than a width w5 of inner part 21. It should be noted that hereinafter a width of a part of the lead corresponds to the maximum width of that part of the lead unless stated otherwise. For example, the particular part may have a tapered form. In such case, the width of the tapered part corresponds to the maximum width of that part.

During the application of the molding compound, at least a clamping portion 232 of outer part 23 arranged directly adjacent to body part 22 was clamped on both sides by a mold.

Package 1 comprises a lid 50 that is fixedly connected to body 30 by means of a glue 52 or other adhesive. A space in between lid 50, body 30 and substrate 10 defines a cavity 51 in which an electronic component 60 is arranged. Here, electronic component 60 may for example comprise a semiconductor die on which a high power RF transistor is arranged. Bondwires 61 are used to enable an electrical connection between the high power RF transistor and leads 20. More in particular, bondwires 61 extend between a bond bar 62 and/or a plurality of bond pads on the semiconductor die and inner parts 21 of leads 20.

Due to the presence of this cavity, this type of package is often referred to as a cavity package. The present invention particularly relates to this type of package.

Reliability and manufacturability of high power RF devices is important. These devices operate in extreme conditions, such as high temperatures, and are often used in devices that should remain operational for longer periods of time, such as base stations for mobile telecommunications 3G/4G/5G.

An electronic package is known from US 2018/082915 A1. Further electronic packages are known from US 2018/096937A1, US 2018/122729A1, US 2009/023248A1, U.S. Pat. Nos. 4,246,697A, 4,012,766 A, US 2005/012186 A1, and US 2006/108679 A1.

The Applicant has found that known cavity packages do not always address the need for high reliability and manufacturability. More in particular, the Applicant has found that the known cavity packages are susceptible to a problem known as molding compound flash and/or bleed. This problem involves molding compound flowing over the inner part of the lead. When this happens, bondwires can no longer be reliably connected to the inner part. The connection between the lead and the electronic component in the package might break over time or may be non-existent from the start. In either case, an electrical failure will occur.

The present invention addresses this problem by means of the electronic package as defined in claim 1. This package is characterized in that a width of the clamping portion is substantially larger than the width of the lead end portion, and each lateral side of the inner part is arranged relative to a corresponding lateral side of the clamping portion such that A) the relevant lateral side of the clamping portion is aligned with or extends beyond the corresponding lateral side of the inner part, or B) the corresponding lateral side of the inner part extends laterally beyond the relevant lateral side of the clamping portion at most by a respective predefined offset such that bending of the inner part or body part relative to the clamping portion during the application of the molding compound was prevented thereby having avoided bleeding of molding compound onto the inner part.

In the known cavity package, the clamping portion has a width that is substantially identical to the width of the lead end portion. The inner part of the lead has a width that is dictated by the width of for example the bond bar and/or the width of the high power transistor. Especially for high power devices, the width of the bond bar is substantially larger than the width of the lead end portion. This latter width is typically governed by electrical considerations as the lead end portion is assumed to be part of a transmission line having a well-defined particular characteristic impedance.

In the known cavity packages, the difference in widths of the lead end portion and the inner part is overcome in the body part. This is illustrated in FIGS. 2A-2C, where the width of the lead changes in the body part as indicated by arrow A.

During the molding process, two mold parts are brought together to create a cavity in which the liquid molding compound will be inserted (in the case of transfer-molding) or injected (in the case of injection molding). These mold parts touch each other at positions where no molding compound should be present in the final package. An important position where these mold parts touch each other is the clamping portion.

At the same time, some inner areas should also be kept free of molding compound although these areas are not clamped by the mold parts. An example of such area is the upper surface of the inner part of the leads. During the molding process, this upper surface is pressed against a mold part (or vice versa) such that molding compound cannot reach this surface. In some cases a film is arranged in between the mold part and the upper surface of the inner part. This process is known as film-assisted molding.

FIG. 2B illustrates the situation described above, where an outer part 23 of a lead 20 is clamped by mold segments M1, M2, and wherein only the topside of inner part 21 is touched by mold segment M3. A corresponding top view is presented in FIG. 2C.

The Applicant has found that the molding process described above in connection with cavity packages sometimes results in flash and/or bleed of molding compound on the upper surfaces of the inner parts of the leads. The Applicant has concluded from simulations and experiments that this problem is associated with an insufficient mechanical stiffness of the leads.

According to the invention, the stiffness of the leads is improved by ensuring that the width of the clamping portion is substantially larger than the width of the lead end portion. The Applicant further concluded that, because the clamping portion is the part of the lead that is clamped, the width of the clamping portion should be chosen such that bending of the inner part and/or body part relative to the outer part during the application of the molding compound is prevented. Such bending would create space for the molding compound between the inner part of the lead and the mold part. The Applicant has realized that in order to prevent the abovementioned bending, it is important that the width of the clamping portion should not deviate too much from the width of the inner part. More in particular, the amount of bending was found to depend on the extent in which the clamping portion extends in the lateral direction relative to the inner part.

The width of the clamping portion can be at least 1.1 times larger than the width of the lead end portion, preferably 1.5 times larger, more preferably 2 times larger, and even more preferably 4 times larger. In addition, the width of the inner part may lie in the range between 0.75 and 8 mm. Moreover, the width of the lead end portion may be larger than 0.25 mm.

The predefined offsets can be chosen higher when the thickness of the leads increases. When the thickness increases the inherent stiffness of the leads increases. A larger difference in widths between the inner part and clamping portion can be allowed without risking molding compound bleeding. The Applicant has found that a substantial linear relationship exists between the thickness and offset. More in particular, each predefined offset in mm equals c times Y, wherein Y equals the thickness of the lead in mm, and wherein c is a constant within the range extending between 1 and 7, and more preferably between 3 and 5, and most preferably equal to 3.

The width of the inner part can be equal to or larger than the width of the clamping portion. Additionally or alternatively, the respective offsets can be equal to or different from each other. It is also possible that the width of the clamping portion equals the width of the inner part although the offset at one side is non-zero, e.g. 0.2 mm. For example, the offset at the other side can be negative, e.g. −0.2 mm.

The thickness of the lead may for example lie in the range between 0.1 mm and 0.35 mm, more preferably between 0.2 mm and 0.3 mm.

The body part and/or inner part may have a tapered form. For example, the width thereof may decrease in a direction away from a center of the package. Alternatively, a width of the clamping portion, the width of the body part, and the width of the inner part may be identical. Alternatively, the width of the clamping portion and the width of the body part are identical but different from the width of the inner part. This latter part is preferably wider than the body part.

The clamping portion may comprise a first outer portion, a second outer portion, and an inner portion, wherein the first and second outer portions are arranged at a distance from the inner portion at opposite sides thereof. This embodiment differs from the embodiment in which the clamping portion is a single piece of metal when viewed along the interface between body part and clamping portion. Using separate outer portions and an inner portion in between which no metal is present provides the advantages of using less metal although substantially the same mechanical stiffness for the leads can be obtained.

The package may further comprise a lid that is fixedly connected to the body, for example by means of glue or a different adhesive, wherein a space in between the lid, the body, and the substrate defines a cavity in which an electronic component is arranged. The electronic component may comprise a semiconductor die mounted to the substrate and a plurality of bondwires extending between the semiconductor die and the inner part of the lead. The package may comprise a radiofrequency 'RF' power transistor arranged on the semiconductor die, wherein the power transistor is connected, using the plurality of bondwires, to the inner part of the lead. More in particular, an output of the RF power transistor may be electrically connected to a bond bar and/or a plurality of bond-pads that is/are arranged on the semiconductor die and that is electrically connected, using said plurality of bondwires, to the inner part. Typically, a width of the bond bar or a combined width of the plurality of bond pads may substantially equal the width of the inner part.

The substrate may be a conductive substrate and may preferably comprise a heatsink, a die pad, and/or a flange. More in particular, the conductive substrate may be used for providing electrical ground. Additionally or alternatively, the body may be ring shaped. In other embodiments, the substrate and the body can be integrally formed.

The package may comprise a plurality of the abovementioned leads, wherein the outer part further comprises a dam bar portion, which is connected to the clamping portion on one end and to the lead end portion on another end and of which edges extend in parallel. These edges were connected, at least during the application of the molding compound for forming the body, to a dam bar that extended parallel to the body between the lead and an adjacent lead among the plurality of leads. Such dam bars are often used in lead frames to increase the mechanical stiffness of the plurality of leads as a whole and to prevent compound leakage during molding. These dam bars form a temporary connection and will be removed mechanically, e.g. by means of punching, after molding or attaching the package lid.

A width of the clamping portion may remain substantially the same in a direction away from the body. More in particular, the edges of the clamping portion may extend in parallel. A width of the clamping portion may be substantially equal to a width of the dam bar portion. For example, the edges of the clamping portion and the edges of the dam bar portion may both extend in parallel.

The lead end portion may have edges that extend in parallel over an entire length of the lead end portion. Alternatively, the lead end portion may have a first sub-portion that is connected directly to the dam bar portion, and a second sub-portion that is connected to the first sub-portion, wherein edges of the second sub-portion extend in parallel over an entire length of the second sub-portion. In this latter case, the first sub-portion may provide a smooth transition between the width of the dam portion and the width of the second sub-portion. An angle of an edge of the lead end portion or an angle of an edge of the first sub-portion relative to a side wall of the body may be within a range of 60 and 120 degrees. For example, the first sub portion may have edges that extend obliquely relative to the body.

According to a second aspect, the present invention provides a lead frame for manufacturing the electronic package as defined above. This lead frame comprises a lead frame body, a substrate that is connected to the lead frame body, and a plurality of leads that are each spaced apart from the substrate and which are mutually connected using one or more dam bars and which are connected to the lead frame body.

The substrate may be connected to the lead frame body using tie-bars including rivets or another mechanical connection, such as gluing, soldering, or welding. Similarly, the leads may be connected to the lead frame body using connecting tabs similar to the abovementioned dam bars.

The leads and the substrate are configured to be mutually fixated by means of a body of a solidified molding compound. The plurality of leads are each configured to penetrate the body from an inside of the package to an outside of the package. Each of the leads comprises an inner part that extends within the inside of the package and that is substantially free of molding compound to allow one or more bondwires to be bonded thereto. Each of the leads further comprises a body part that extends within the body, and an outer part that extends on the outside of the package and that is substantially free of molding compound.

A width of a lead end portion of the outer part may be substantially smaller than a width of the inner part. At least a clamping portion of the outer part arranged directly adjacent the body part was clamped on both sides by a mold during the application of the molding compound.

The lead frame is characterized in that a width of the clamping portion is substantially larger than the width of the lead end portion, and each lateral side of the inner part is arranged relative to a corresponding lateral side of the clamping portion such that A) the relevant lateral side of the clamping portion is aligned with or extends beyond the corresponding lateral side of the inner part, or B) the corresponding lateral side of the inner part extends laterally beyond the relevant lateral side of the clamping portion at most by a respective predefined offset such that bending of the inner part or body part relative to the clamping portion during the application of the molding compound was prevented thereby having avoided bleeding of molding compound onto the inner part.

The leads may be configured as described in conjunction with the electronic package discussed above.

According to a third aspect, the present invention provides an electronic device comprising the electronic package as described above.

Next the invention will be described in more detail referring to the appended drawings, wherein.

Figure 1:
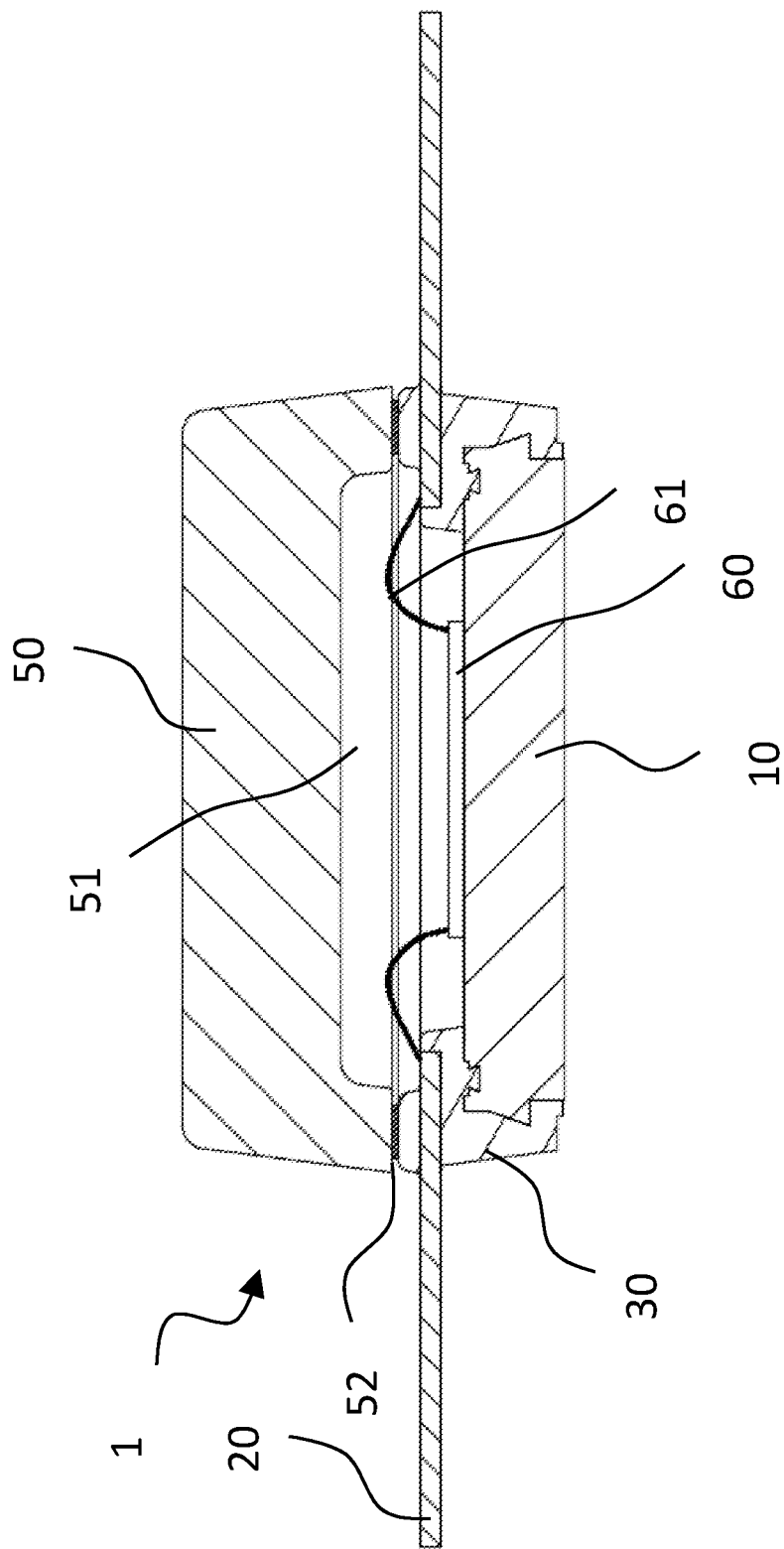
FIG. 1 illustrates a cross-sectional view of a known electronic package.
Figure 3:
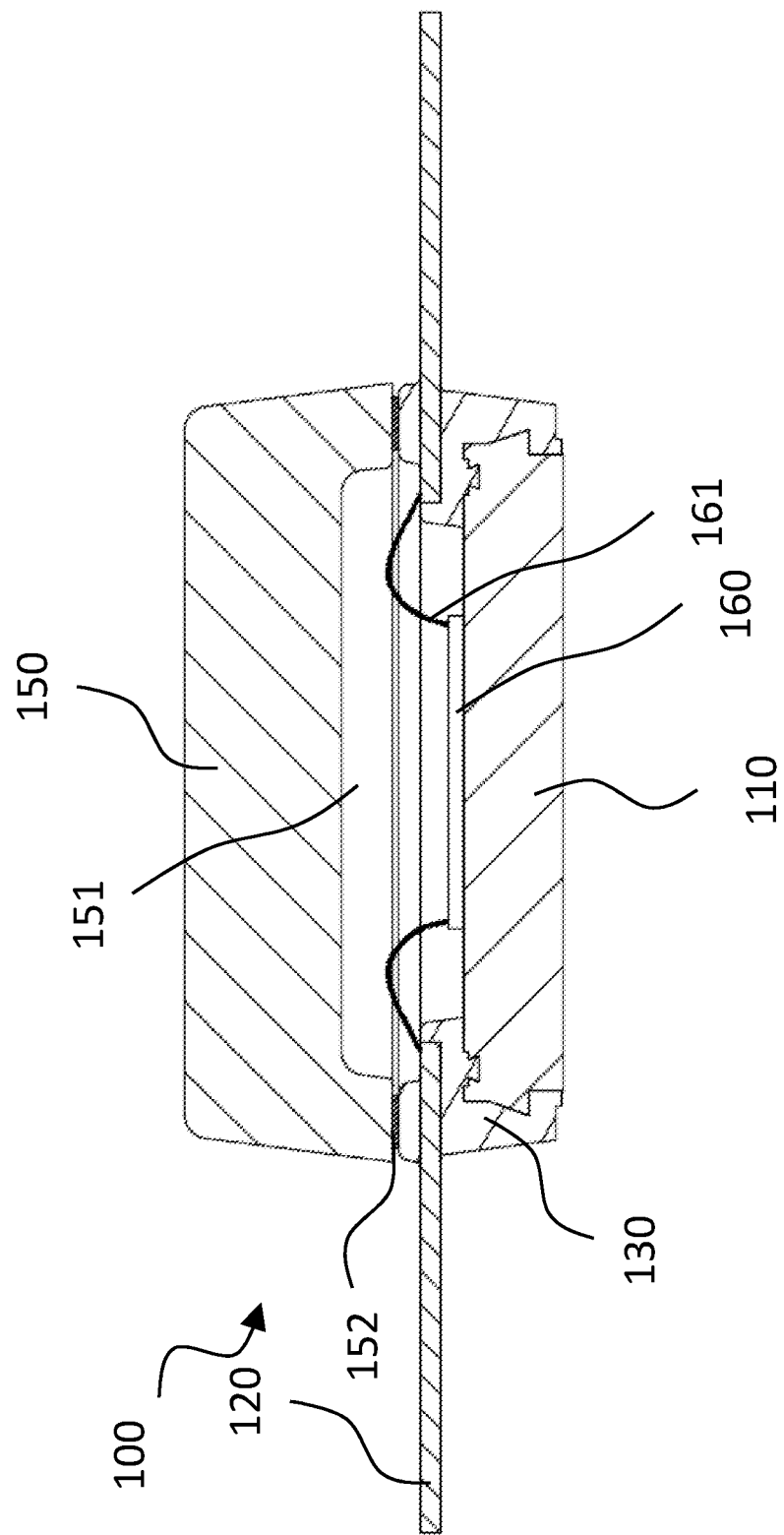
FIG. 3 illustrates a cross-sectional view of an electronic package in accordance with the present invention.
Figure 4:
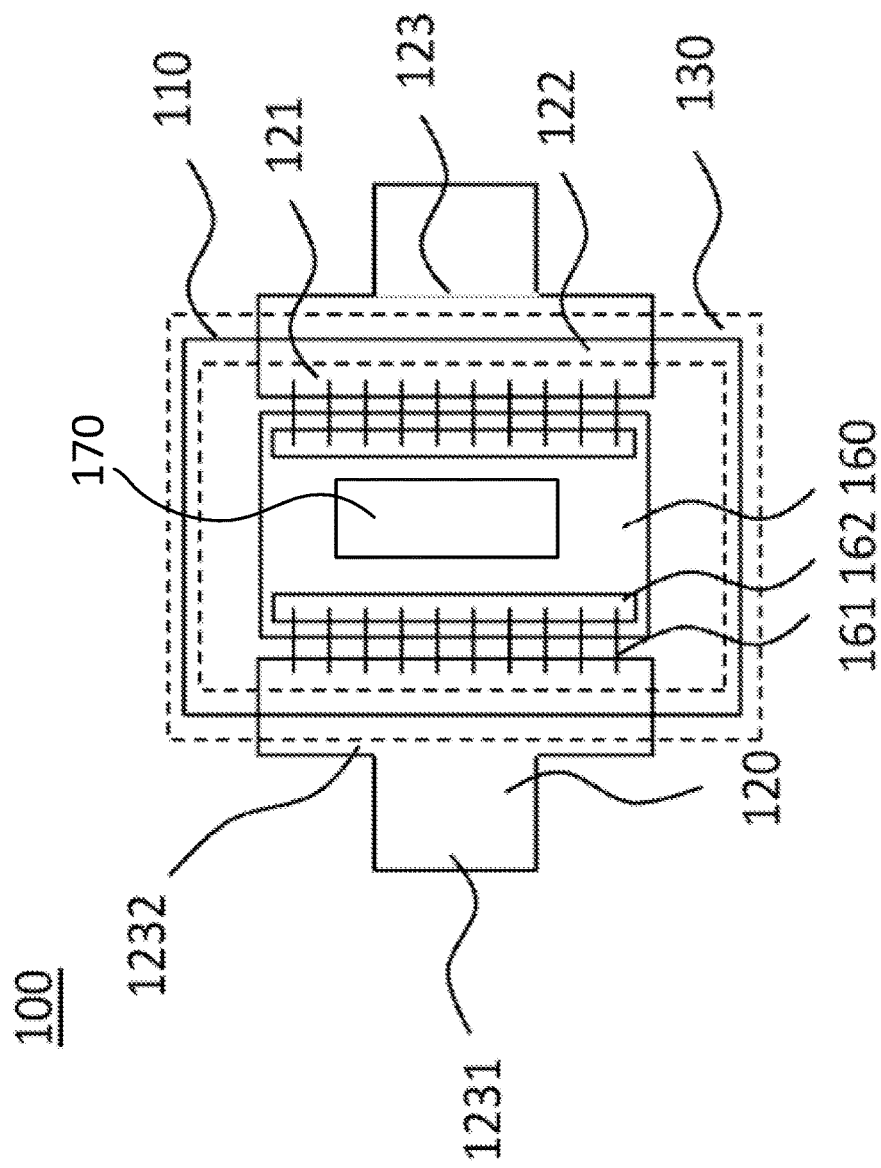
FIG. 4 illustrates a top view of an electronic package in accordance with the present invention.

FIG. 3 illustrates a cross-sectional view of an electronic package 100 in accordance with the present invention and FIG. 4 illustrates a top view of an electronic package 100 in accordance with the present invention. As can be deduced by comparing FIGS. 1 and 3, there are no differences in the cross sectional views between the known electronic package and electronic package 100 according to the invention. Similar to the known electronic package, electronic package 100 comprises a substrate 110, leads 120 that are spaced apart from substrate 110 and a body 130 of a solidified molding compound. Package 100 further comprises a lid 150 that is fixedly connected to body 130 by means of a glue 152 or other adhesive. A space in between lid 150, body 130 and substrate 110 defines a cavity 151 in which an electronic component 160 is arranged. Here, electronic component 160 may for example comprise a semiconductor die on which a high power RF transistor 170 is arranged. Bondwires 161 are used to enable an electrical connection between the high power RF transistor 170 and leads 120.

Figure 2A:
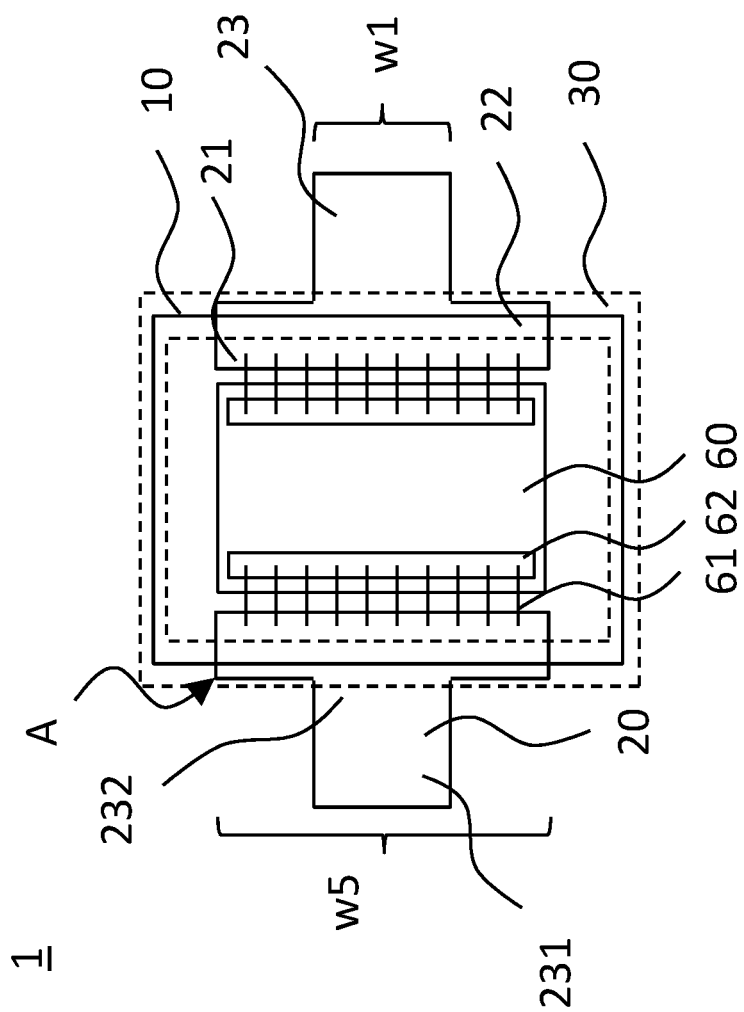
FIG. 2A illustrates a top view of a known electronic package.
Figures 2B, 2C:
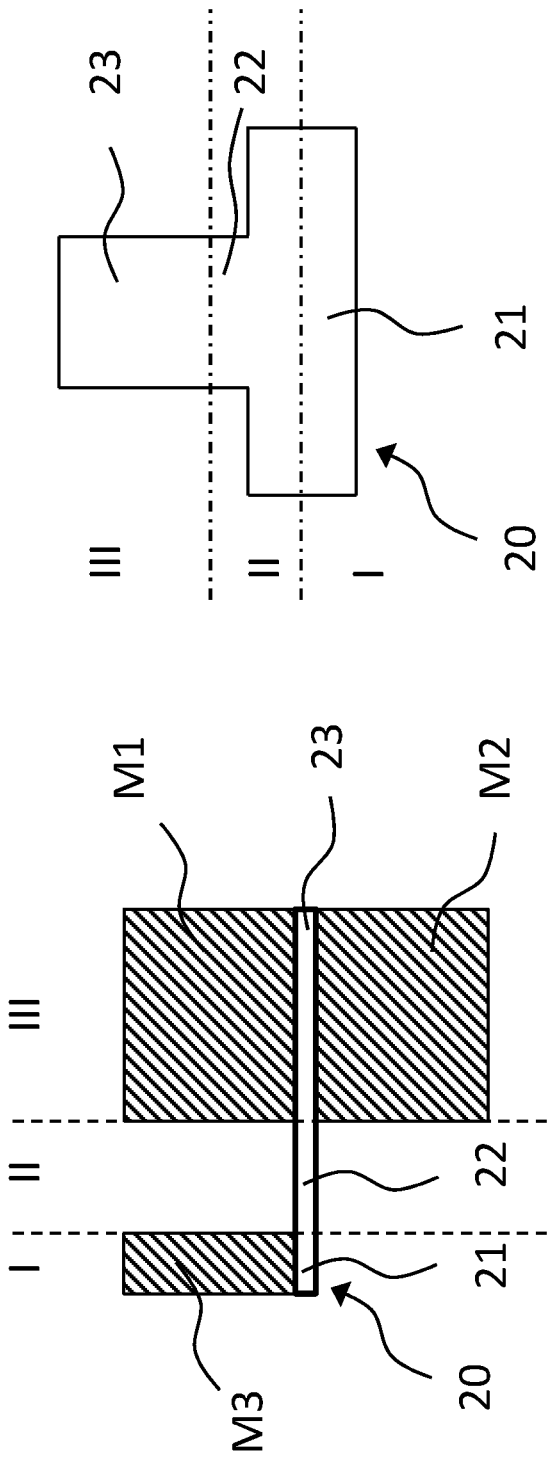
FIGS. 2B-2C illustrate the molding process for the package of FIG. 2A.

FIG. 4 illustrates a top view of an electronic package 100 in accordance with the present invention. Comparing to the top view of the known package 1 shown in FIG. 2A, outer part 123 of leads 120 differs in that clamping portion 1232 is much wider than clamping portion 232 in FIG. 2A. More in particular, clamping portion 1232 is much wider than lead end portion 1231. Similar to FIG. 2A, leads 120 still comprise an inner part 121 and a body part 122.

Figure 5:
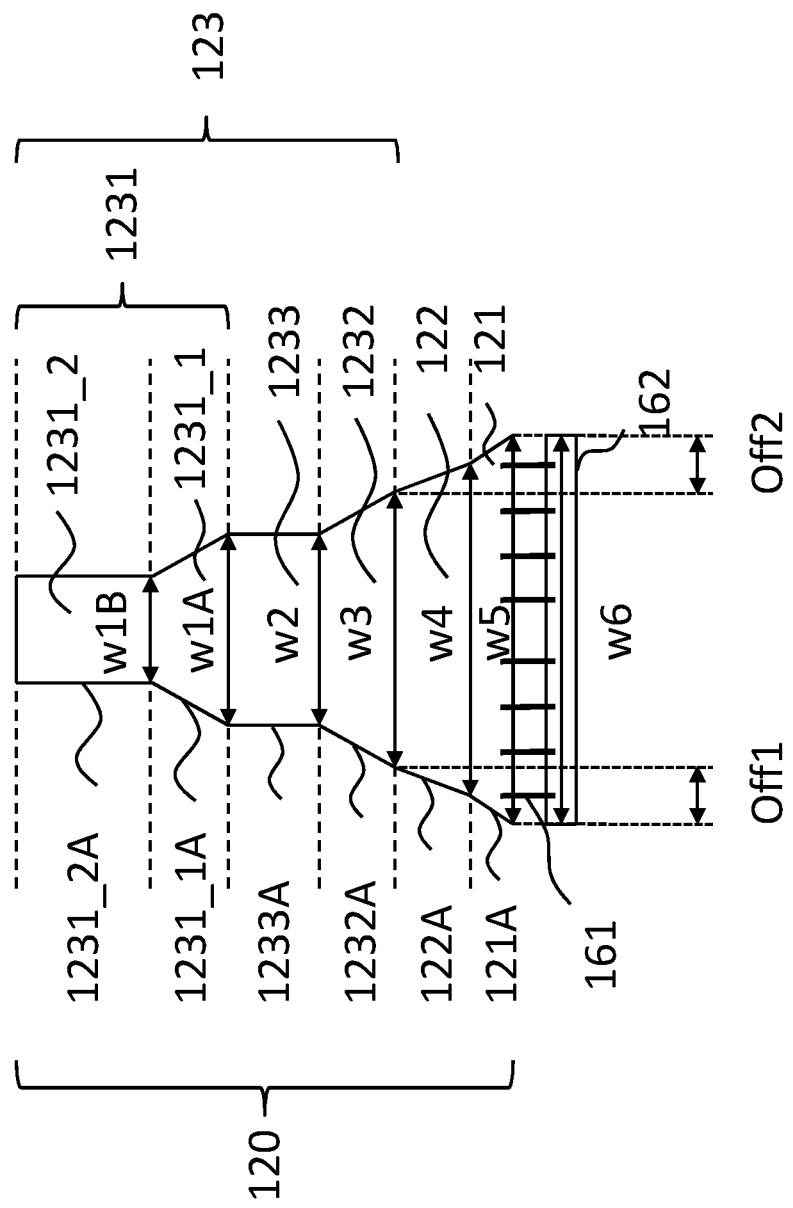
FIG. 5 illustrates a general shape of a lead in accordance with the present invention.

FIG. 5 illustrates a general shape of a lead in accordance with the present invention. As can be seen in the figure, most portions of lead 120 can have a tapered form. Moreover, although FIG. 5 shows a tapering away from the center of package 100, a reverse tapering may equally be possible for some portions of lead 120. In addition, the lead shown in FIG. 5 is symmetrical. It should however be noted that the invention does not exclude non-symmetrical leads.

For each portion, a width w1-w5 is indicated. Here, the width corresponds to the maximum width for a given portion. For example, w5 corresponds to the maximum width of inner part 121.

Referring to FIG. 5, an electronic component is arranged inside package 100. This component (not shown in FIG. 5) is connected to a bond bar 162. Bondwires 161 extend between bond bar 162 and inner part 121. The interface between inner part 121 and body part 122 is indicated by a dotted line. Moreover, w4 indicates the maximum width of body part 122. Body part 122 is connected to clamping portion 1232 having a width w3 which in turn is connected to dam bar portion 1233 having a width w2. This latter portion 1233 is connected to lead end portion 1231 which can be subdivided in a first sub-portion 1231_1 having a width w1A and a second sub-portion 1231_2 having a width w1B.

As can be seen in FIG. 5, edges 1231_2A and 1233A of second sub-portion 1231_2 and dam bar portion 1233, respectively, run parallel, whereas edges 1231_1A, 1232A, 122A, 121A of first sub-portion 1231_1, clamping portion 1232, body part 122, and inner part 121, respectively, show a tapered form. It should be noted that this tapered form is but an example. Other embodiments in which some or all of these edges run parallel are equally possible. An example thereof is illustrated in FIG. 4. Here it can be seen that at or near the interface between clamping portion 1232 and dam bar portion, the width of lead 120 suddenly changes.

Figure 6:
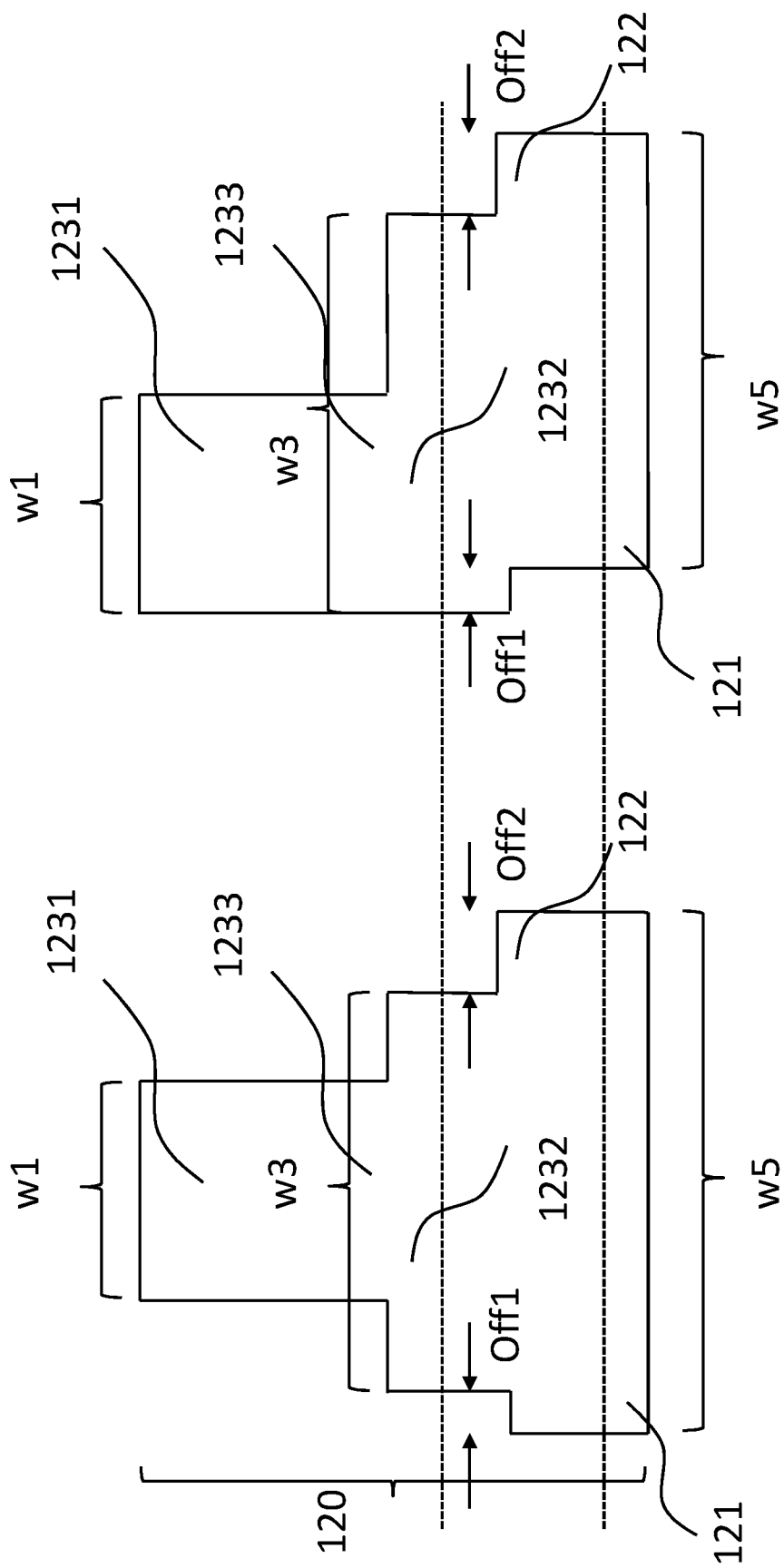
FIG. 6 illustrates two possible shapes of a lead in accordance with the present invention.

FIG. 6 illustrates two possible shapes of a lead in accordance with the present invention. The example on the left is characterized in that a different offset is with respect to the left and right sides of inner part 121. In both cases, the width of lead 120 changes within body part 122 and at or near the interface between clamping portion 1232 and dam bar portion 1233.

The example on the right is characterized in that on the left hand side, clamping portion 1232 extends beyond inner part 121. This could be characterized by a negative offset Off1. On the other side, inner part 121 extends beyond clamping portion 1232 by an offset Off2. Furthermore, lead end portion 1231 is not arranged symmetrically with respect to both inner part 121 and clamping portion 1232.

Figure 7:
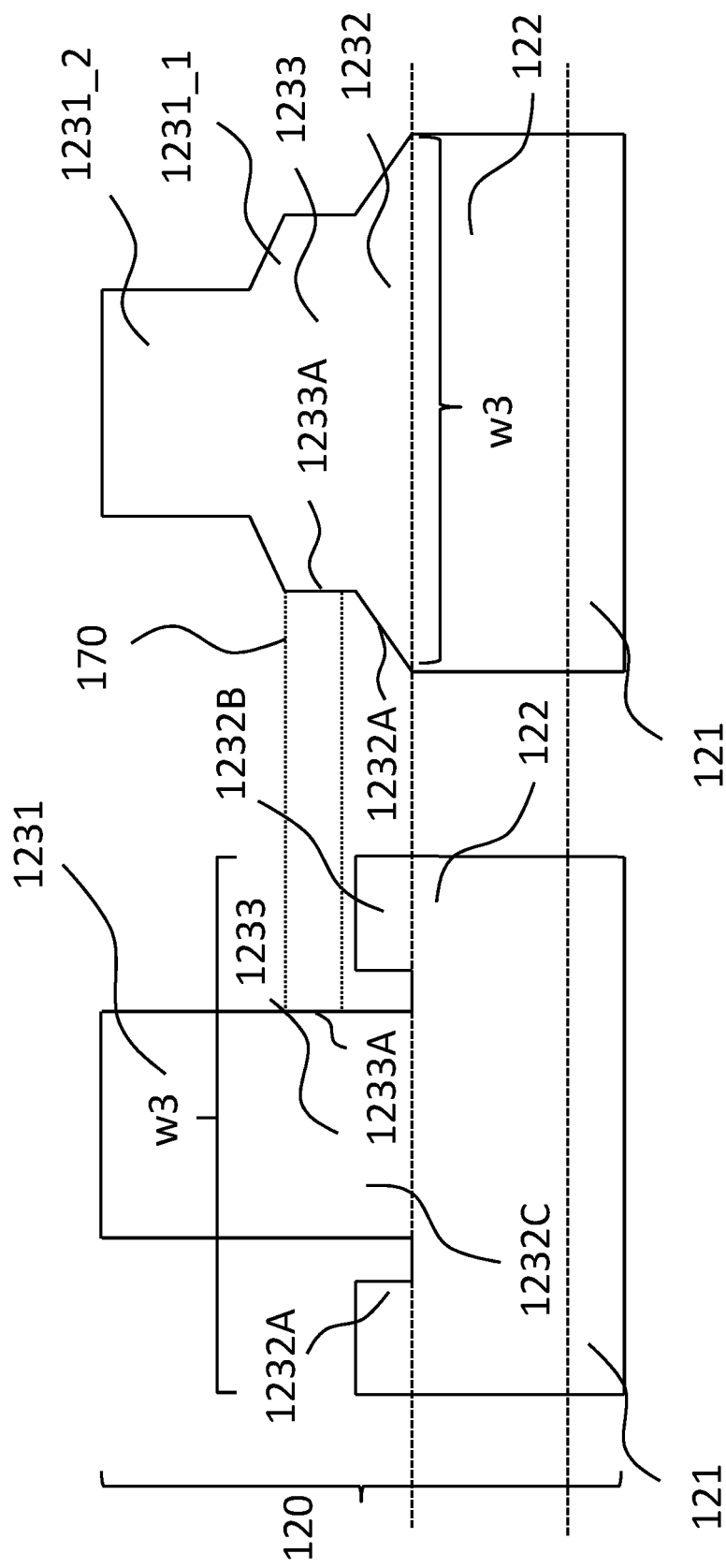
FIG. 7 illustrates two further possible shapes of a lead in accordance with the present invention.

FIG. 7 illustrates two further possible shapes of a lead in accordance with the present invention. Here, the dotted line indicates the interface between clamping portion 1232 and body part 122.

The shape on the left differs from the shape shown in FIGS. 4-6 in that clamping portion 1232 comprises outer portions 1232A, 1232B that are spaced apart from inner portion 1232C. Moreover, the widths of inner portion 1232C, dam bar portion 1233 and lead-end portion 1231 are all identical.

The shape on the right illustrates that clamping portion 1232 may have a tapered form similar to first sub-portion 1231_1. The angle of edges 1232A with respect to the side of body 130 cannot however be too large. To illustrate this, a dam bar 170 is shown in FIG. 7 that could extend between both leads shown in FIG. 7 if these leads were simultaneously used in package 100. The skilled person will readily appreciate that this configuration is for explanatory purposes only as most packages will have only one type of lead 120. Moreover, dam bar 170 is only present before isolation of the various packages 100 from the corresponding lead frame.

Figure 8:
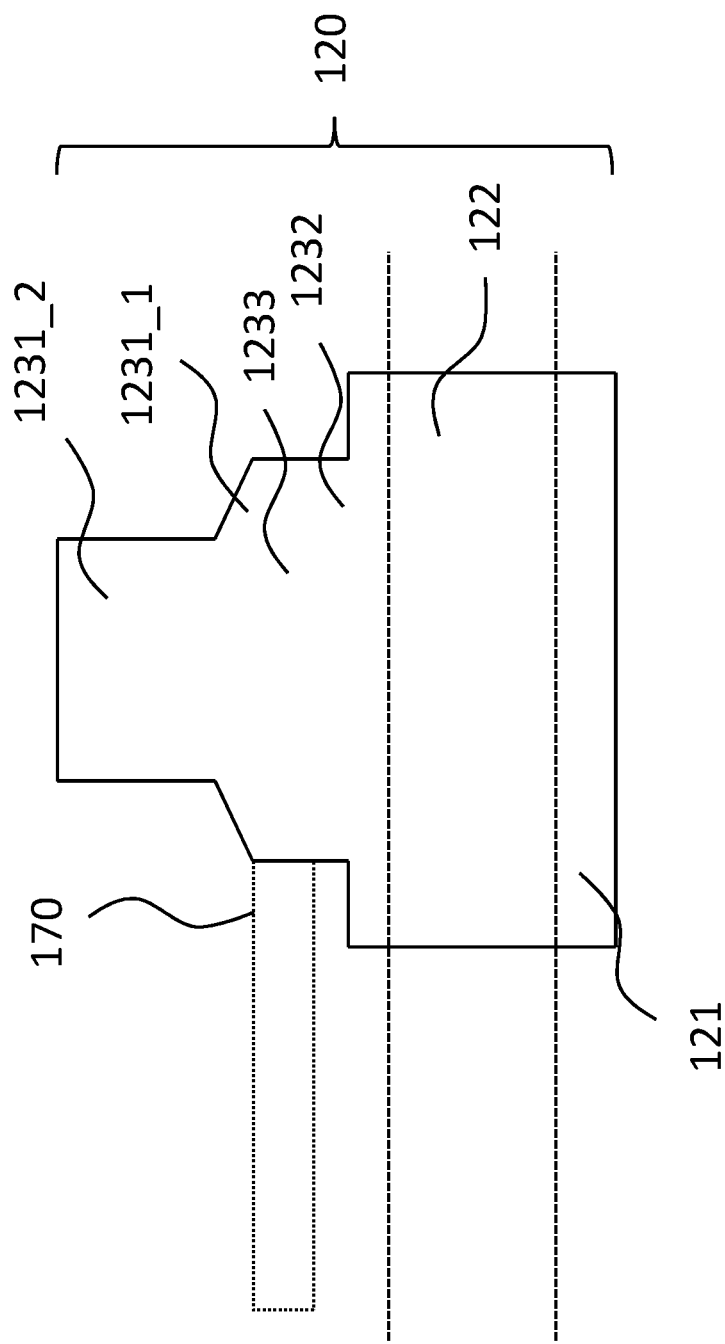
FIG. 8 illustrates an even further possible shape of a lead in accordance with the present invention.

If the angle of edges 1232A is too large, there will be not enough space in between dam bar 170 and edge 1232A to cut through dam bar 170. This problem is addressed in the shape shown in FIG. 8. Here, the width of lead 120 shows a step within clamping portion 1232. It should be noted that in these embodiments, a clear boundary between clamping portion 1232 and dam bar portion 1233 is not visible.

Figure 9:
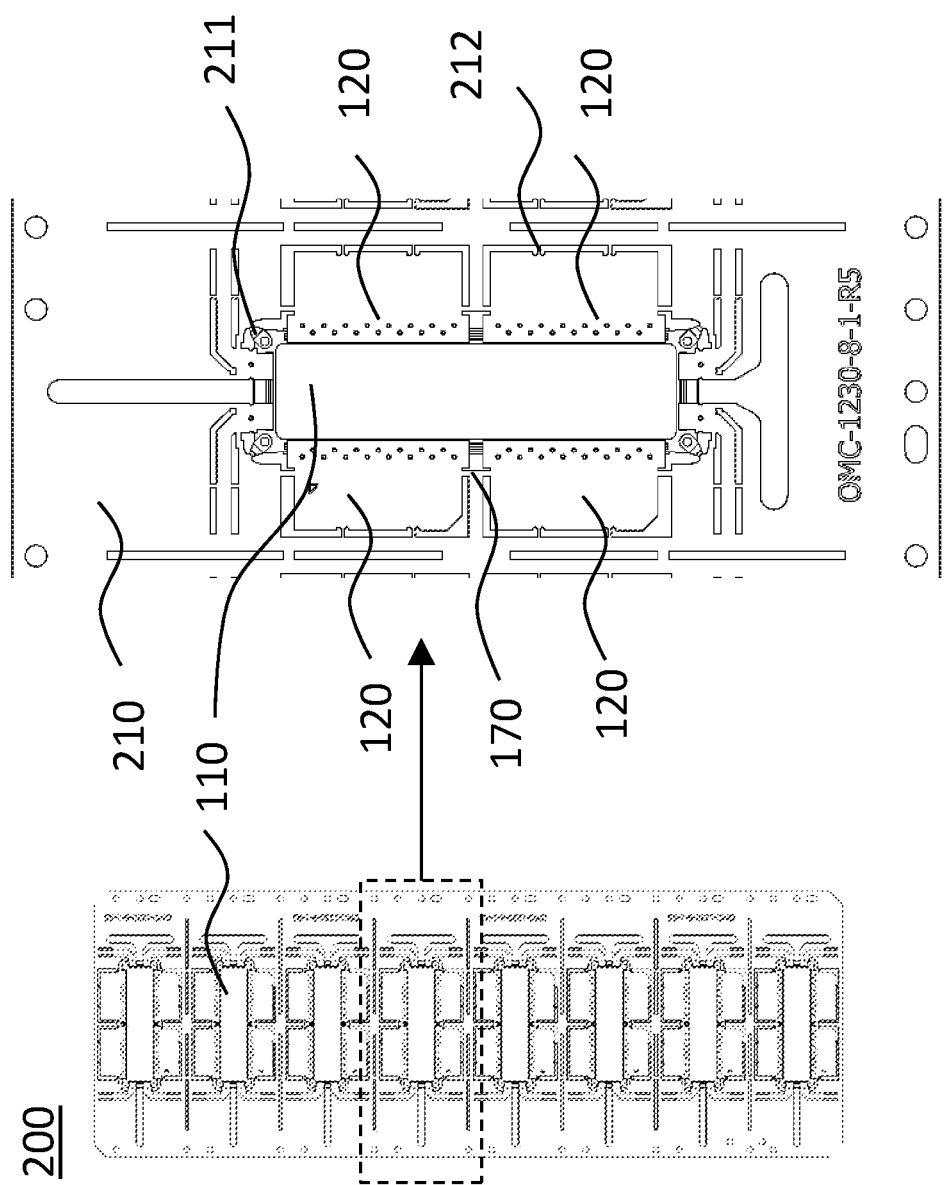
FIG. 9 illustrates an embodiment of a lead frame in accordance with the present invention.

FIG. 9 illustrates an embodiment of a lead frame 200 in accordance with the present invention. Lead frame 200 comprises lead frame body 210 and is to be used for simultaneously manufacturing a plurality of electronic packages 100. To that end, lead frame 200 comprises, for each electronic package 100 to be manufactured, a substrate 110 and a plurality of leads 120. As shown, substrates 110 are connected of lead frame body 210 using tie-bars 211. Leads 120 are mutually connected using dam bars 170. Connecting tabs 212 provide a further connection to lead frame body 210.

To manufacture electronic packages 100 using lead frame 200, molding compound will be applied as a first step to realize body 130. Body 130 fixates substrates 110 relative to leads 120. As a next step, electronic component(s) will be placed onto substrate 110 and bond wire connections will be realized between the electronic component(s) and leads 120. Thereafter, lids 150, which are manufactured using a separate molding process, are fixedly connected to bodies 130. As a final step, tie-bars 211, dam bars 170, and connecting tabs 212 will be punched through thereby isolating electronic packages 100 from a remainder of lead frame 200.

In the description above, the present invention has been described using detailed embodiments thereof. However, the skilled person will readily appreciate that the invention is not limited to these embodiments but that various modifications can be made without departing from the scope of invention which is defined by the appended claims.

The invention claimed is:

1. A molded cavity electronic package, comprising:
a substrate;
a plurality of leads, each lead being spaced apart from the substrate;
a body of a solidified molding compound directly and fixedly attached to the substrate and the plurality of leads;
a lid that is fixedly connected to the body, wherein a space surrounded by the lid, body and substrate defines a cavity in which an electronic component is arranged;
wherein each respective lead among the plurality of leads penetrates the body from an inside of the package to an outside of the package;
wherein each respective lead among the plurality of leads comprises:
an inner part that extends within the inside of the package and that is substantially free of molding compound to allow one or more bondwires to be bonded thereto;
a body part that extends within the body; and
an outer part that extends on the outside of the package and that is substantially free of molding compound;
wherein the electronic component comprises a semiconductor die mounted to the substrate and a plurality of bondwires extending between the semiconductor die and the inner parts;
wherein, for each respective lead among the plurality of leads:
a width (w1) of a lead end portion of the outer part is substantially smaller than a width (w5) of the inner part;
the outer part comprises at least a clamping portion arranged directly adjacent the body part and having two sides, the clamping portion being adapted to be clamped on both sides by a mold;
the thickness of the respective lead lies in the range between 0.1 mm and 0.35 mm;
a width (w3) of the clamping portion is at least 1.1 times larger than the width of the lead end portion of the outer part;
the width of the inner part lies in the range between 0.75 and 8 mm; the width of the lead end portion of the outer part is larger than 0.25 mm;
the width (w3) of the clamping portion, the width (w4) of the body part, and the width (w5) of the inner part are each identical.

2. The electronic package according to claim 1, wherein, for each respective lead among the plurality of leads, the thickness of the respective lead lies in the range between 0.2 mm and 0.3 mm.

3. The electronic package according to claim 1, wherein, for each respective lead among the plurality of leads, the width (w3) of the clamping portion is at least 1.5 times larger than the width of the lead end portion of the outer part.

4. The electronic package according to claim 1, further comprising a high power radio frequency 'RF' transistor arranged on the semiconductor die, said power transistor being connected, using the plurality of bondwires, to the inner part.

5. The electronic package according to claim 4, wherein an output of the high power RF transistor is electrically connected to a bond bar and/or a plurality of bond pads that is/are arranged on the semiconductor die and that is electrically connected, using said plurality of bondwires, to the inner part.

6. The electronic package according to claim 5, wherein a width (w6) of the bond bar or a combined width of the plurality of bond pads substantially equals the width (w5) of the inner part.

7. The electronic package according to claim 1, wherein the substrate is a conductive substrate, wherein the conductive substrate comprises at least one of: a heatsink, a die pad, or a flange.

8. The electronic package according to claim 1, wherein the body is ring shaped.

9. An electronic device comprising the electronic package according to claim 1.

\* \* \* \* \*